United States Patent [19]

Hieber et al.

[11] Patent Number: 4,562,089
[45] Date of Patent: Dec. 31, 1985

[54] METHOD OF MEASURING ELECTRIC RESISTANCE OF THIN METALLIC LAYERS MANUFACTURED UNDER THE INFLUENCE OF A PLASMA

[75] Inventors: Konrad Hieber, Bernau; Norbert Mayer, Munich, both of Fed. Rep. of Germany

[73] Assignee: Siemens Aktiengesellschaft, Berlin & Munich, Fed. Rep. of Germany

[21] Appl. No.: 663,760

[22] Filed: Oct. 22, 1984

[30] Foreign Application Priority Data

Nov. 10, 1983 [DE] Fed. Rep. of Germany ....... 3340719

[51] Int. Cl.$^4$ ............................................. C23C 15/00
[52] U.S. Cl. .................................. 427/10; 204/192 R
[58] Field of Search ....................... 427/10; 204/192 R

[56] References Cited

U.S. PATENT DOCUMENTS 4,331,702  5/1982  Hieber et al. ......................... 427/10

FOREIGN PATENT DOCUMENTS 0067432  6/1982  European Pat. Off. .

OTHER PUBLICATIONS

"Structural Changes of Evaporated Tantalum During Film Growth", by K. Hieber and N. M. Mayer, paper presented at the Fifth International Thin Film Congress, Herzlia-On-Sea, Israel, Sep. 21-25, 1981.
"Resistance Measurements by Radio Telemetric System During Film Deposition by Sputtering", by N. M. Mayer, Siemens Forsch-u. Entwickl.-Ber. Bd., 11, (1982), Nr. 6. pp. 322-326.
"Design of Plasma Deposition Reactors", by Wayne L. Johnson, Solid State Technology, Apr. 1983, pp. 191-195.
IPAT 77 Proceedings, Conference "Ion Plating & Allined Techniques", Edinburgh, Jun. 1977, D. G. Teer and B. L. Delcea, pp. 58-69.
"The RF Sputtering Process", by C. W. Pitt, University College, London, Dept. of Electronic & Elec. Eng., pp. 149-156.
1981 American Vacuum Society, J. Vac. Sci. Technol., 18(3), Apr. 1981, "Process Conditions Affecting Hot Electron Trapping in DC Magnetron Sputtered MOS Devices", by N. A. Bojarczuk, pp. 890-894.

Primary Examiner—Bernard D. Pianalto
Attorney, Agent, or Firm—Hill, Van Santen, Steadman & Simpson

[57] ABSTRACT

A method of measuring the electrical resistance of thin metallic films manufactured under the influence of a plasma. The measurement proceeds by means of a direct current resistance measurement according to the principle of a two point or four point measuring method. The electrical resistance is determined either in the case of at least one measuring or test current, and the voltage connected to the measuring contacts is measured when no measuring or test current is sent through the film, or the electrical resistance is determined in the case of at least two different measuring or test currents of known magnitudes. The measuring methods are applied in the case of manufacture of metallic layers in semiconductor technology, in particular also for the measurement of the ion current injected in the film by the plasma as well as for the determination of variations in the coating rate.

12 Claims, 8 Drawing Figures

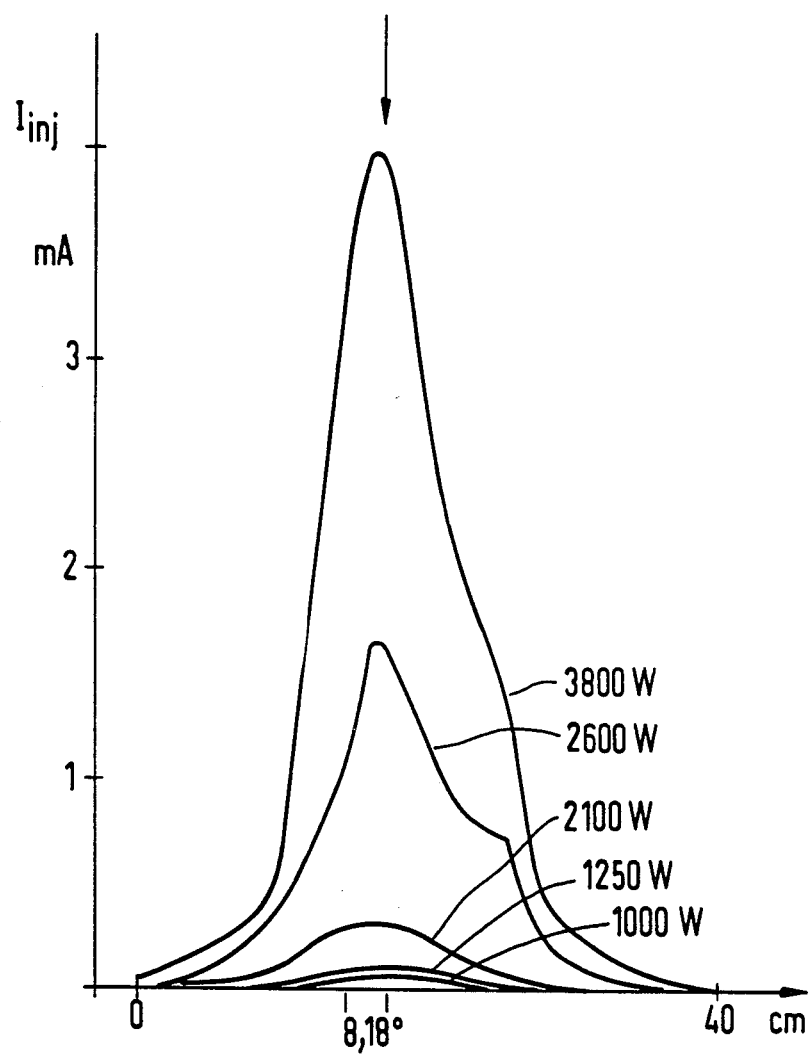

METHOD OF MEASURING ELECTRIC RESISTANCE OF THIN METALLIC LAYERS MANUFACTURED UNDER THE INFLUENCE OF A PLASMA

BACKGROUND OF THE INVENTION

The invention relates to a method for measuring electrical resistance of thin metallic layers or films manufactured under the influence of a plasma. A direct current or ohmic resistance measurement according to the principle of the two point-or four point-measuring method is provided. The invention also relates to applications of the measuring method.

As is known from an article of Hieber and Mayer from Thin Solid Films, 90 (1982), pages 43 to 50, incorporated herein by reference, the measurement of the electrical resistance of metallic films during the film manufacture makes it possible to determine already during the film manufacture, changes of structure, alloy composition, and/or microstructure.

In fabrication, for example of printed circuits in semiconductor technology, metallic layers are most frequently manufactured in cathode sputtering systems (sputter systems) with vacuum load locks. During the coating, the semiconductor crystal substrates to be coated are constantly moved or rotated back and forth under one or more sputter targets. An apparatus which makes it possible to measure the electrical resistance of films during the manufacture in cathode sputtering systems (sputter systems) with a vacuum load lock and a moved (rotatable) substrate pallet, is described in the Siemens Research and Development Reports, Vol. 11 (1982), No. 6, on pages 322 to 326 in an article by N. M. Mayer and the European Patent Application No. 0 067 432, both incorporated herein by reference. The resistance measuring device with a measuring data transmission system is here mounted on the side of the substrate pallet not facing the cathode sputtering plasma (sputter plasma). The resistance measurement proceeds with the known four point-measuring method in the case of D.C. current. The measured resistances are transmitted by radio from the coding chamber to a receiver outside the sputter system, and from there are transferred to a computer for data storage and evaluation.

Measurements with this measuring apparatus on tantalum layers during the manufacture with a DC-magnetron can be learned from the already cited Siemens Research and Development Reports, Vol. 11 (1982) No. 6, pages 332–326, incorporated herein by reference.

If the electric film resistance is measured in dependence upon the time, the resistance is then lowered gradually or in steps with each sputtering-on of a new film layer. In this regard, reference is made to FIG. 1, which represents in a diagram the resistance progression in dependence upon time in the case of the layer-wise coating of a substrate with tantalum during RF-diode-sputtering. Plotted as the ordinate is the resistance in ohms. Plotted as the abscissa is the sputter time in sec. However, if the film approaches the sputter target and thus the influence region of the plasma necessary for the cathode sputtering, the measured electric resistance becomes falsified. In FIG. 1, this is visible by the peaks at each stage. The expansion, position, and the energy content of the sputter plasma in the coating chamber is dependent upon the sputter conditions, the sputter method (i.e. sputtering two or more targets simultaneously (co-sputtering) in the modes RF (radio frequency)-sputtering and/or DC (direct current) sputtering with or without magnetron), and the sputter performance. Influencing of the electrical measurements is particularly great in the case of RF sputtering or in the case of sputtering of several targets simultaneously. In these cases, it is at least partially no longer possible to measure the electrical resistance of the film without the influence of the plasma during a pallet rotation since the sputter plasma extends over the entire coating space, whereas the plasma in the case of DC sputtering of a target with low power is disposed only in a proximity of the target.

SUMMARY OF THE INVENTION

It is an object of the invention to disclose methods with which the electrical resistance of thin metallic films can be measured in a sputter system during coating; i.e. while the film is positioned in the sputter plasma or even directly beneath the sputter target. It is unimportant here whether the film is moved through beneath the target, or whether it lies stationary beneath the target. A further object of the invention is to employ this measuring method in order to determine the electron current and the ion current injected by the plasma into the film, as well as to detect changes in the coating speed (sputter rate) or the spatial distribution of the sputter plasma.

The invention proceeds from the following considerations:

During sputtering, argon atoms are ionized and accelerated toward the target. Upon impact of the argon ions on the target, atoms and/or ions of the material to be coated are released from the target which strike the substrate disposed beneath the target. Accordingly, atoms of the material to be coated strike the substrate or the film to be measured, partially in the form of neutral particles, and partially in the form of ions, such as argon ions, as well as electrons. Details for this method are disclosed in: article by Teer and Delcea, and article by Pitt, in Proceedings of Conference "Ion Plating and Allied Techniques", Edinburg, June 1977, Pages 58 to 69 and pages 149 to 156; the article by Johnson in Solid State Technology, April 1983, pages 191 to 195; and the article by Bojarczuk from J. Vac. Sci. Technol. 18 (3), April 1981, pages 890 to 894, all incorporated herein by reference.

The particles which are not electrically neutral inject a current into the film. If the electrical resistance of this film is measured by a DC current method (two point or four point measuring method), the injected current $I_{inj}$ becomes superimposed on the measuring current $I_m$ and thus falsifies the voltage $U_M$ dropping across the film, and, according to Ohm's law, falsifies the measured resistance $R_M$ of the film.

The invention makes use of this knowledge and solves the problem which is posed above in two ways. The first solution relates to a measuring method of the initially cited type which is characterized by determining the electrical resistance or the voltage drop via the film in the case of at least one measuring current and, immediately before or thereafter, the voltage connected to the measuring contacts, which voltage drops via the film, is measured if no measuring current is sent through the film. This allows the voltage drop produced by the injected current in the film to be measured directly.

The second solution relates to a measuring method of the type initially cited which is characterized by determining the electrical resistance or the voltage drop via the film in the case of at least two different measuring currents $I_{M1}$ and $I_{M2}$ of a known magnitude. The measuring currents $I_{M1}$ and $I_{M2}$ are selected corresponding to the film resistance, and the difference between the employed measuring currents is selected in the range of the ratio 2 to 100. Preferably a ratio of approximately 10 between the measuring currents ($I_{M1}/I_{M2} \approx 10$ for $I_{M1} > I_{M2}$) exists in order to ascertain the true film resistance as precisely as possible.

Table 1 provides an overview of the employed measuring currents.

TABLE 1

| Layer Resistance Range Ω | Typical Measuring Currents | Employed Measuring Currents in the Test |
|---|---|---|
| greater than 10000 | less than 100 μA | |
| 10000–1000 | 50 μA–1 mA | 100 μA |
| 1000–100 | 10 μA–5 mA | 1 mA, 100 μA |
| 100–10 | 100 μA–10 mA | 5 mA, 1 mA, 100 μA |
| 10–1 | 1 mA–20 mA | 2 mA, 5 mA, 1 mA |
| less than 1 | greater than 10 mA | 20 mA |

It lies within the scope of the invention that the measurements (in the case of both solutions) are carried out in a time interval of 0.01 to 1 sec, and preferably in a time interval of 0.2 sec. The time interval for the two measurements must be so selected that the film resistance, as a consequence of the sputtering-on or as a consequence of the incorporation of other foreign atoms into the film, can change only slightly ($\Delta R < 1\%$, and at best $< 0.1\%$). The measuring currents must be selected corresponding to the film resistance (see Table 1). The magnitude of the injected voltage $U_{inj}$ to be measured is dependent upon the film resistance, the sputter method (RF and/or DC with or without magnetron) and the sputter performance; i.e. the energy density of the sputter plasma.

From the measurement of the film resistance $R_M$ and the injected voltage $U_{inj}$, the true film resistance $R_W$ results as follows:

From $$R_M = \frac{U_M}{I_M}$$

$$U_{inj} = R_W \cdot I_{inj}$$

$$R_W = \frac{U_M}{I_m + I_{inj}}$$

for the first solution there results:

$$R_W = \frac{R_M \cdot I_m - U_{inj}}{I_M} \quad (I)$$

Figure 1:
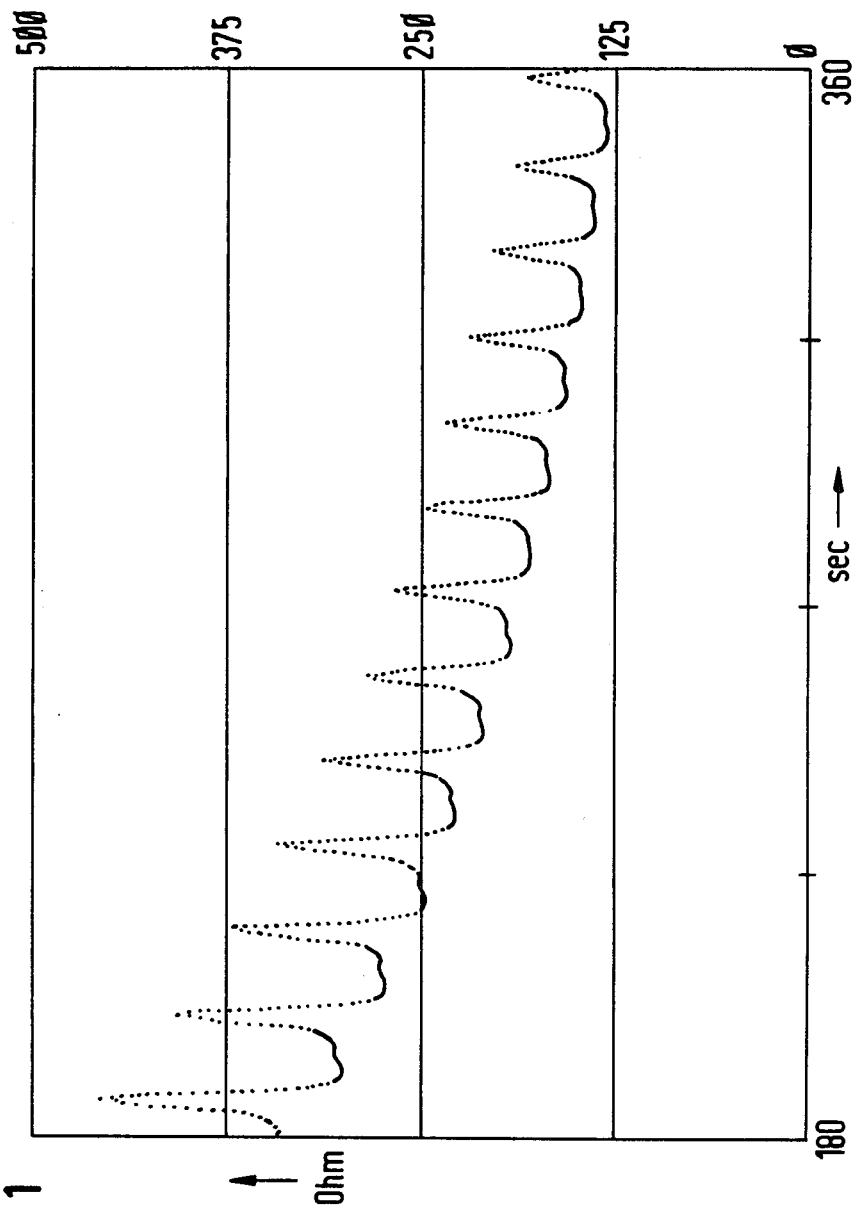
FIG. 1 is a diagram of resistance progression.
Figure 2A:
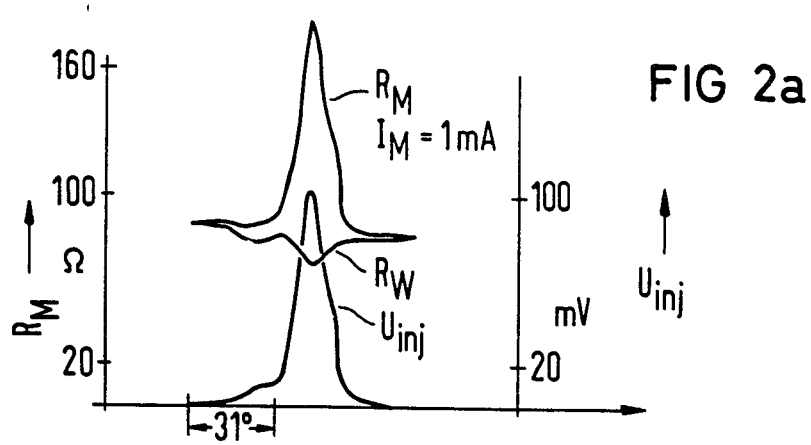
Figure 2B:
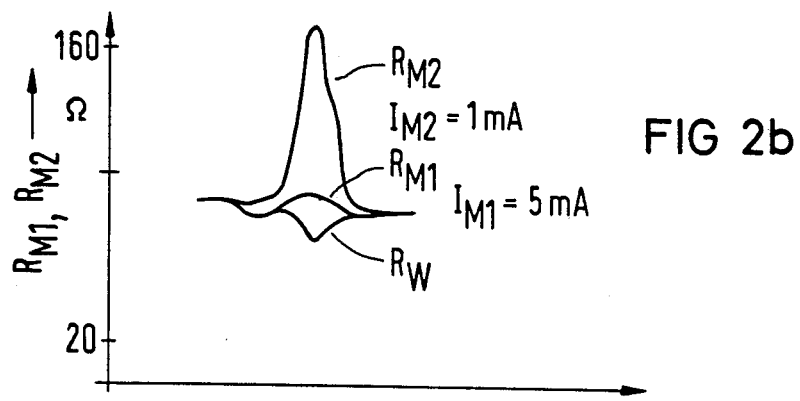
Figure 2C:
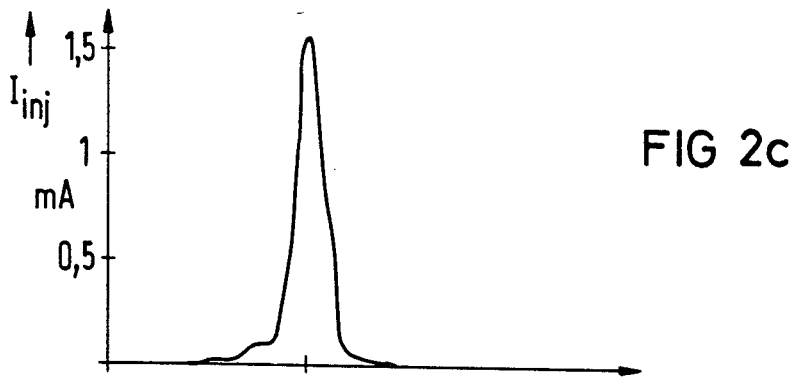
Figure 3A:
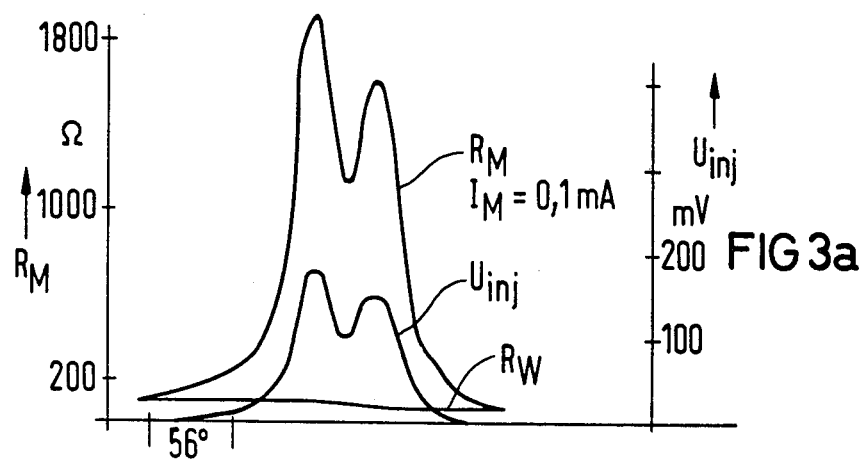
Figure 3B:
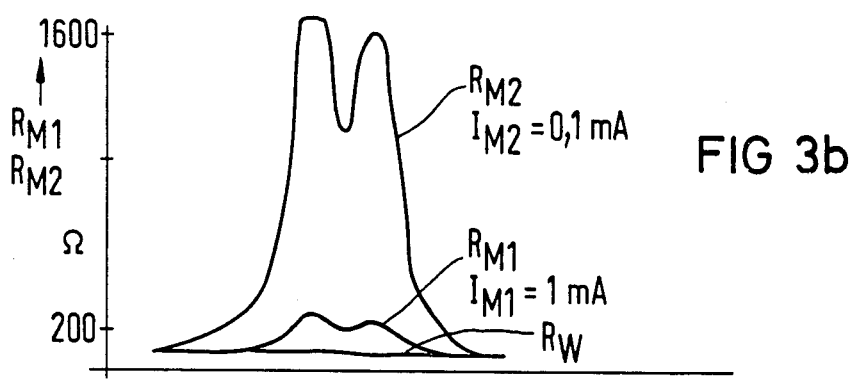
Figure 3C:
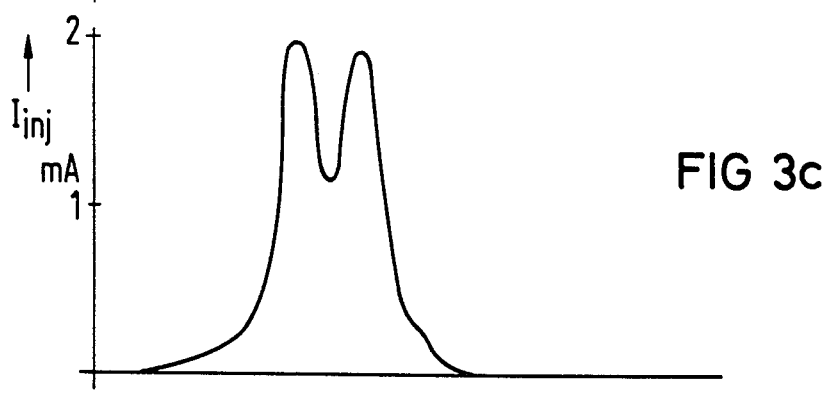

In the following, the invention shall be explained in greater detail on the basis of sample embodiments and FIGS. 2 through 4:

FIGS. 2 and 3 show the change of the measured film or layer resistance ($R_M$, $R_{M1}$, $R_{M2}$), the injected voltage $U_{inj}$ of the true film resistance $R_W$, and the injected current $I_{inj}$ in dependence upon the location. FIGS. 2a, 2b, and 2c relate to the sputter mode DC-magnetron-sputtering; and FIGS. 3b and 3c relate to the sputter mode RF-diode sputtering.

FIG. 4 illustrates in the diagram the injected currents in dependence upon the location and the target power.

The following relations result:

(a) Use of 2 known measuring currents

The true resistance value $R_W$ results from the two measured resistances $R_{M1}$ and $R_{M2}$ which are obtained in the case of the two measuring currents $I_{M1}$ and $I_{M2}$:

According to (I):

$$R_W = \frac{R_{M1} \cdot I_{M1} - U_{inj}}{I_{M1}}$$

$$R_W = \frac{R_{M2} \cdot I_{M2} - U_{inj}}{I_{M2}}$$

Conditions: $I_{M1} \neq I_{M2}$ and $I_{M1}, I_{M2} \neq 0$

Preferred: $I_{M1}, I_{M2} > 0$ or $I_{M1}, I_{M2} \neq 0$, i.e. the current direction is in each instance the same.

For the second solution there results:

$$R_W = \frac{R_{M1} \cdot I_{M1} - R_{M2} \cdot I_{M2}}{I_{M1} - I_{M2}} \quad (II)$$

(b) Use of more than 2 known measuring currents

In order to increase the precision it is possible to employ more than two measuring currents. The true resistance $R_W$ is then determined as a mean value from the computed values $R_{W i,j}$ according to formula (II), whereby all measuring currents are coupled with one another: for example, for 3 measuring currents:

$$R_{W i,j} = \frac{R_{Mi} \cdot I_{Mi} - R_{Mj} J_{Mj}}{I_{Mi} - I_{Mj}}$$

with $R_{W1,2}$, $R_{W1,3}$ and $R_{W2,3}$ there follows:

$$R_W = \frac{R_{W1,2} + R_{W1,3} + R_{W2,3}}{3}$$

(c) Combination of Solution 1 and 2

A combination of the two solutions 1 and 2 is also conceivable; namely, the measurement of the electrical resistance in the case of two known measuring currents as well as the measurement of the injected voltage.

That which has been already stated above applies to the measuring current selection as well as the time in which the measurements are to be conducted.

$R_W$ is then likewise determined as a mean value of the results of solutions 1 and 2. As the examples show, the method is independent of the sputter method, sputter power or performance, the employed material, or the rotational speed of the pallet.

It is possible, by means of the measuring methods according to the teaching of the invention, to determine the true film resistance in the sputter plasma. In addition to the possibilities of employing the resistance value for a dynamic control of the vapor deposition process obtained in this way, such as is described, for example in the German OS No. 30 04 149 (incorporated herein by reference), the following additional application possibilities are of technical interest:

From the known true film resistance, it is possible to determine the current injected into the film by the sputter plasma:

$$I_{inj} = \frac{I_M(R_M - R_W)}{R_W} \quad \text{(III)}$$

In contrast with the injected voltage $U_{inj}$, the injected current is not dependent upon the film resistance, but is dependent only upon the energy density of the sputter plasma. The energy density, in turn, is influenced by the material which is sputtered on, the sputter method (RF-, DC- in each instance, with or without magnetron and in combination) and the target voltage. If the sputter rate now changes during the coating (material and sputter method are here constant), which most often is the result of a change of the target voltage, this is expressed in a change of $I_{inj}$.

It is thus possible to determine, during the coating process, changes in the sputter rate via a determination of the current injected into the film.

Changes in the sputter rate or in the injected current can occur locally and/or chronologically.

(a) Local changes

If during the coating process, in the case of moved substrates, the film is repeatedly transported (in intervals) beneath the sputter target; i.e. the film "sees" a local variable sputter plasma which varies in dependence upon the location of the film in the coating space.

(b) Chronological Change

A chronological change of the sputter plasma becomes noticeable when $I_{inj}$ varies, given a specific position of the film in relation to the target from passage of the film beneath the target. This chronological change is detectable either through measurements of $I_{inj}$ at one or more positions beneath the target and comparison of the individual measured or test values from passage to passage, or calculation of the integral (surface) from $I_{inj}$ and the path covered between the individual measurements of $I_{inj}$ and comparison of the integral value.

If the film (Substrate) is disposed on a rotatable pallet, and for each second a measuring cycle (measurement according to solution a or b) takes place, then the film per second travels the path X; for each path section $X_i$ one then obtains an injected current value $I_{inj}$.

The integral comparison value then results through: $V = \int I_{inj} \cdot d_x$, whereby the "path" via which integration is carried out can be determined as the path of the film beneath the target. It can be any other random path segment or even an entire rotation of the pallet. The integration can proceed with the known numeric methods, for example, with the aid of the Simpson formula. The comparison of the integral value yields a greater accuracy than the comparison of individual values of $I_{inj}$. In the case of computers, with integration via the path beneath each individual target, the variation of the sputter rate per target results; and with integration via the path of an entire pallet rotation, the variation of the entire sputter performance results. It is thus possible to monitor, during the manufacture of alloy films, whether variations in the alloy composition occur.

This check of the sputter rate (concentration) is of the greatest significance in terms of the manufacture of films for use in semiconductor components, since the film properties are permitted to vary here only within very narrow boundaries. This detection of variations in the sputter rate can also be employed for a control of the sputter rate.

The value of the determined variation of $I_{inj}$ or $\int I_{inj} \cdot d_x$ can be used as the controlled variable which generates a control signal with the aid of which the power of performance supply for the target is altered (proportional regulator).

SAMPLE EMBODIMENTS

The telemetric resistance measuring apparatus described in the article of N. M. Mayer in Siemens Research and Development report, Vol. 11 (1982), pages 322–326, can be modified as follows:

| Channel | Resistance Measuring Channel | Measuring or test Current |
|---|---|---|
| 1 | 0–1 | 20 mA |
| 2 | 0–10 | 2 mA |
| 3 | 0–100 | 5 mA |
| 4 | 0–1000 | 1 mA |
| 5 | 0–10000 | 100 A |
| 6 | −200 mV to +200 mV | — |
| 7 | For Temperature Measuring Purposes | |
| 8 | For Temperature Measuring Purposes | |

The measurement proceeds in such a fashion that every 1/10 sec the measuring or test current of the next channel is sent through the film and then the resistance value, or in the case of channel 6, the injected voltage, is measured. This sampling of all channels proceeds cyclically; i.e. after channel 8, a new cycle is again commenced with channel 1.

With use of the channels 5 and 6, taking solution 1 as a basis, the two necessary measurements proceed in 0.2 sec. The use of channels 4 and 5 is analogous, taking as a basis the solution 2 and a film with an electric resistance of less than 1000Ω.

As a sputter system, the system of Perkin-Elmer was employed which possesses a high vacuum load lock, and in which during the coating, the substrates are disposed on a rotating pallet (diameter target: 20 cm, substrates are disposed on a radius of 20 cm).

1st Sample Embodiment:
Sputter method: DC-magnetron (DC current)
Material: Tantalum
Power on the target: 1020 Watts
Time for a pallet rotation: 4.4 sec
Solution 1:

A known measuring current is used and the electric resistance $R_M$ and the voltage $U_{inj}$ measured without measuring or test current.

The result of measurements for a passage of the film beneath the target is shown by Table 2 as well as FIG. 2a. When the film is moved into the sputter plasma, the measured resistance and the voltage initially increase and then drop again when the film again leaves the sputter plasma (local variation of the plasma in the coating space).

TABLE 2

| $R_M$ [Ω] | $U_{inj}$ [mV] | $R_W$ [Ω] | $I_{inj}$ [μA] |
|---|---|---|---|
| $I_M = 0.1$ mA | | | |
| 952 | 0.9 | 943 | 10 |
| 1026 | 10.5 | 921 | 114 |
| 1267 | 39.1 | 876 | 446 |
| 1282 | 42.7 | 855 | 500 |
| 1140 | 34.1 | 799 | 427 |
| 913 | 11.2 | 801 | 143 |
| 752 | −3.3 | 785 | −42 |
| $I_M = 1$ mA | | | |
| 942 | 0.9 | 941.1 | 9.6 |
| 921 | 10.5 | 910.5 | 115 |

TABLE 2-continued

| $R_M$ [Ω] | $U_{inj}$ [mV] | $R_W$ [Ω] | $I_{inj}$ [μA] |
|---|---|---|---|
| 906 | 39.1 | 866.9 | 451 |
| 881 | 42.7 | 838.3 | 509 |
| 840 | 34.1 | 805.9 | 423 |
| 804 | 11.2 | 792.8 | 141 |
| 778 | −3.3 | 781.3 | −42 |

Solution 2

Two known measuring or test currents are used for measurement of two electrical resistances. The result of measurements for a passage of the film beneath the target is shown by Table 3 as well as FIG. 2b.

TABLE 3

| $R_{M1}$ [Ω] $I_{M1}$ = 0.1 mA | $R_{M2}$ [Ω] $I_{M2}$ = 1 mA | $R_W$ [Ω] | $I_{inj}$ [μA] |
|---|---|---|---|
| 952 | 942 | 940.9 | 10 |
| 1026 | 921 | 909.3 | 130 |
| 1267 | 906 | 865.9 | 460 |
| 1282 | 881 | 836.4 | 530 |
| 1140 | 840 | 806.7 | 410 |
| 913 | 804 | 791.9 | 150 |
| 752 | 776 | 780.9 | −40 |

The progression of the current injected into the film by the plasma is shown by FIG. 2c. Directly beneath the sputter target accordingly the influence is greatest.

2nd Sample Embodiment
Sputter Method: RF (high frequency)
Material: Tungsten
Power on the Target: 1900 Watts
Time for a Pallet Rotation: 6.4 sec

TABLE 4

| Solution 1, | | | |
|---|---|---|---|
| $R_M$ [Ω] | $U_{inj}$ [mV] | $R_W$ [Ω] | $I_{inj}$ [mA] |
| 1597 | 145.1 | 146 | 0.994 |
| 1336 | 119.3 | 143 | 0.834 |
| 1197 | 105.0 | 147 | 0.714 |
| 1228 | 108.2 | 146 | 0.741 |
| 1626 | 149.6 | 130 | 1.151 |
| 1941 | 181.7 | 124 | 1.465 |

The progression of the measured or test values in the case of a passage of the film beneath the target is shown by FIGS. 3a and b as well as Table 5. The progression of the injected current is shown by FIG. 3c. In contrast with the influence of the plasma in the case of the DC-magnetron in the case of RF-sputtering a minimal influence occurs if the film is disposed precisely beneath the target.

TABLE 5

| Solution 2, | | | |
|---|---|---|---|
| $R_{M1}$ [Ω] $I_{M1}$ = 1 mA | $R_{M2}$ [Ω] $I_{M2}$ = 0.1 mA | $R_W$ [Ω] | $I_{inj}$ [mA] |
| 291 | 1597 | 145.9 | 0.995 |
| 263 | 1336 | 143.8 | 0.829 |
| 247 | 1197 | 141.4 | 0.747 |
| 252 | 1228 | 143.6 | 0.755 |
| 281 | 1626 | 131.6 | 1.135 |
| 314 | 1941 | 133.2 | 1.357 |

Use of 3 known measuring or test currents.

TABLE 6

| $R_{M1}$ [Ω] $I_{M1}$ = 5 mA | $R_{M2}$ [Ω] $I_{M2}$ = 1 mA | $R_{M3}$ [Ω] $I_{M3}$ = 0.1 mA | $R_{W12}$ [Ω] | $R_{W13}$ [Ω] | $R_{W23}$ [Ω] | $R_W$ | $I_{inj}$ [mA] |
|---|---|---|---|---|---|---|---|
| 86.6 | 97 | 203 | 84 | 84.2 | 85.2 | 84.47 | 0.126 |
| 87.0 | 99 | 230 | 84 | 84.1 | 84.4 | 84.17 | 0.135 |
| 87.5 | 101 | 264 | 84.1 | 83.9 | 82.9 | 83.63 | 0.231 |
| 88.7 | 105 | 310 | 84.6 | 84.2 | 82.2 | 83.67 | 0.303 |
| 90.6 | 118 | 405 | 83.8 | 84.2 | 86.1 | 84.7 | 0.348 |
| 92.7 | 129 | 552 | 83.6 | 83.3 | 82.0 | 82.97 | 0.586 |
| 95.8 | 145 | 735 | 83.5 | 82.8 | 79.4 | 81.9 | 0.848 |
| 83.8 | (84) | (85) | | | | 83.8 | — |
| 83.8 | (84) | (84) | | | | | |

Table 6 shows that the value of $R_W$ during the sputtering corresponds to the measured resistance value which one obtains after disconnection of the sputter target (-plasma). As a consequence of the reactive surface of the W-film, after the disconnection of the sputter operation, a coverage of the surface with foreign atoms (Ar, $O_2$, etc.) results, whereby the film resistance again slightly increases (see the values in the lower portion of Table 6).

TABLE 7

| Combination of solution 1 and Solution 2 | | | | | | |
|---|---|---|---|---|---|---|
| $R_{M1}$ [Ω] | $R_{M2}$ [Ω] | $U_{inj}$ [mV] | $R_{W1}$ [Ω] | $R_{W2}$ [Ω] | $R_W$ [Ω] | $I_{inj}$ [mA] |
| 341 | 2017 | 185.8 | 155.2 | 154.8 | 155 | 1.2 |
| 265 | 1241 | 108.2 | 156.6 | 156.7 | 156.7 | 0.69 |
| 233 | 938 | 78.6 | 154.4 | 154.7 | 154.6 | 0.51 |
| 208 | 698 | 54.7 | 153.3 | 153.6 | 153.5 | 0.36 |

Examples 1 and 2 show that the method functions independently of the sputter method DC or RF with its different plasmas. Also, the sputtered material here has no influence.

3rd Sample Embodiment
Sputter method: DC-magnetron cosputtering
Material: Tantalum, silicon, (P-doped)
Power: Total: 2610 Watts; Tantalum: 950 Watts; Silicon: 1660 Watts
Time for a Pallet Rotation: 4.4 sec The result of measurements in a plasma which is produced by two targets is shown by Table 8 while the film is moved through beneath the two targets. The influence of the two targets (plasmas) can be clearly seen. First the tantalum target (upper portion of Table 8) and then the silicon target (lower portion of Table 8).
Solution 1: $R_{M1}$ and $U_{inj}$ yield $R_{W1}$
Solution 2: $R_{M1}$ and $R_{M2}$ yield $R_{W2}$

TABLE 8

| $R_{M1}$ [Ω] $I_{M1}$ = 1 mA | $R_{M2}$ [Ω] $I_{M2}$ = 0.1 mA | $U_{inj}$ [mV] | $R_{W1}$ [Ω] | $R_{W2}$ [Ω] | $I_{inj}$ [μA] |
|---|---|---|---|---|---|
| 637 | 681 | 4.9 | 632 | 632 | 8 |
| 645 | 774 | 14.0 | 631 | 630 | 24 |
| 654 | 962 | 34.5 | 620 | 619 | 56 |

TABLE 8-continued

| $R_{M1}$ [Ω] $I_{M1}$ = 1 mA | $R_{M2}$ [Ω] $I_{M2}$ = 0.1 mA | $U_{inj}$ [mV] | $R_{W1}$ [Ω] | $R_{W2}$ [Ω] | $I_{inj}$ [μA] |
|---|---|---|---|---|---|
| 680 | 1385 | 78.1 | 602 | 602 | 130 |
| 672 | 1927 | 139.8 | 532 | 533 | 262 |
| 689 | 1871 | 131.7 | 557 | 558 | 236 |
| 660 | 1136 | 52.4 | 608 | 607 | 87 |
| 639 | 882 | 27.5 | 612 | 612 | 44 |
| 661 | 1126 | 51.3 | 610 | 609 | 85 |
| 653 | 1600 | 105.4 | 548 | 548 | 192 |
| 615 | 1543 | 103.8 | 511 | 512 | 201 |
| 583 | 1233 | 72.4 | 511 | 511 | 141 |
| 601 | 752 | 16.5 | 585 | 584 | 29 |
| 615 | 662 | 5.0 | 610 | 610 | 9 |
| 619 | 659 | 4.6 | 614 | 615 | 7 |

As a consequence of surface coverages, the layer resistance after the sputtering-on of the Ta-partial film (upper portion of the Table) again increases. Upon application of silicon (lower portion of the Table), first diffusion operations take place, whereby the film resistance initially again drops in order to then again rise as a consequence of surface coverage by foreign atoms.

4th Sample Embodiment (illustrated by FIG. 4):
Sputter method: DC-magnetron
Material: Tantalum
Time for a pallet rotation: 4.4 sec From measurement to measurement, the pallet rotates through 8.18°, and the film is thus moved 2.86 cm. In FIG. 4, the injected currents are plotted as a function of the path of the film for different sputter powers. For comparison of the variations of individual values of $I_{inj}$ the pallet position marked with an arrow was selected. For calculation of $\int I_{inj} \cdot dx$ (corresponds to the surface which is bounded by the curve, the horizontal axis, and the integration boundaries) the numerical integration method according to Simpson was selected. Integration is carried out over 15 measurements corresponding to a path of 40.04 cm. The distance beneath the target amounts of approximately 20 cm. The result is shown by Table 9.

TABLE 9

| Power Watts | Rate [nm/min] | $I_{inj}$ [mA] | $\int I_{inj} \cdot dx$ 40 cm |
|---|---|---|---|
| 3800 | 50 | 3.9759 | 46.95 |
| 2600 | 38.7 | 1.632 | 19.61 |
| 2100 | 29.5 | 0.3148 | 4.08 |
| 1250 | 19 | 0.1124 | 1.52 |
| 1000 | 16 | 0.0708 | 0.88 |

Variations in the power, as is known, results in a variation in the sputter rate. This altered sputter rate is clearly determinable by an alteration in the current which is injected through the plasma into the film. For reasons of accuracy it is prudent not to compare the injected current of only one location as the comparison value, but to employ the sum of several measurements or, in particular, to employ the described integral (=surface) as a comparison value.

5th Sample Embodiment
Sputter Method: RF (High Frequency)
Material: Tungsten
Time for a pallet rotation: 6.4 sec.

From measurement to measurement, the pallet rotates through 5.6°, and the film thus moves 1.96 cm. The integration again proceeds according to the method of Simpson, and the integration path amounts to 17.64 cm. The result is shown in Table 10.

TABLE 10

| Power Watts | Rate [nm/min] | $I_{inj}$ [mA] | $\int I_{inj} \cdot dx$ 17.66 cm |
|---|---|---|---|
| 1900 | 13.7 | 1.97 | 31.32 |
| 1000 | 7.2 | 1.40 | 21.09 |

A variation of the sputter rate, in turn, results in a variation in the current which is injected through the plasma into the film.

6th Sample Embodiment
Sputter Method: DC-magnetron, Co-sputtering
Material: Tantalum, Silicon (P-doped)
Time for a pallet rotation: 4.4 sec Each target possesses a separate energy supply, so that the power for each target can be altered independently of the other. In the experiment, the Ta target power was kept constant, whereas the power on the Si target is varied. Films with varying concentration are thus produced.

The integration proceeds over 11.44 cm (5 values of $I_{inj}$) directly beneath the Si-target:

TABLE 11

| Conc. Si (Remainder Ta) Mol % | $I_{inj}$ mA | $I_{inj} \cdot dx$ 11.44 cm |
|---|---|---|
| 29.5 | 0.0617 | 0.452 |
| 33.0 | 0.0429 | 0.315 |
| 35.0 | 0.0338 | 0.297 |
| 36.5 | 0.0303 | 0.256 |
| 37 | 0.0272 | 0.242 |

The power on the Si-target varies here from 650 to 1000 Watts. In this case, in which the power (=rate) is only slightly altered, the comparison of the integral values is particularly suitable. A clear connection between the Si-concentration (=sputter rate) and $I_{inj}$, or $\int Inj \cdot dx$, results.

Although various minor changes and modifications might be proposed by those skilled in the art, it will be understood that we wish to include within the claims of the patent warranted hereon all such changes and modifications as reasonably come within our contribution to the art.

We claim as our invention:

1. In a method for measurement of electrical resistance during manufacture of thin metallic films produced under influence of a plasma, wherein a direct current or ohmic resistance measurement is made at measuring contacts according to a two or four-point measuring method, wherein the improvement comprises the steps of:

determining one of the parameters resistance $R_M$ or voltage drop $U_M$ over at least a portion of the film given at least one measuring or test current $I_M$; and measuring a voltage $U_{inj}$ dropping across at least the portion of the film at the measuring contacts when no measuring or test current $I_M$ is sent through the film while it is under the influence of the plasma during the manufacture of the film and at a time close to a time when the measuring or test current $I_M$ is applied, the two measuring times lying within a time interval of 0.01 to 1 second, whereby an effect on the measurement by current injected by the plasma is determined.

2. A method according to claim 1 wherein the voltage $U_{inj}$ is measured at a time immediately before the voltage drop $U_M$ is determined.

3. A method according to claim 1 wherein the voltage $U_{inj}$ is determined at a time immediately after determining the voltage drop $U_M$.

4. In a method for measurement of electrical resistance during manufacture of thin metallic films produced under influence of a plasma, wherein the improvement comprises the steps of:

determining a voltage drop $U_M$ over at least a portion of the film at the measuring contacts given at least one measuring or test current $I_M$; and measuring a voltage drop $U_{inj}$ across at least a portion of the film when no measuring or test current $I_M$ is sent through the film, the two measurements of voltage drops $U_M$ and $U_{inj}$ both occurring within a time interval of 0.01 to 1 second and also during presence of the plasma during manufacture of the film, whereby an effect on the voltage drop $U_M$ due to the presence of plasma which induces a current in the film can be determined.

5. A method according to claim 1 wherein the current injected by electrons and ions in the film from the plasma is measured by measuring the voltage $U_{inj}$.

6. A method according to claim 1 wherein variations in a concentration of the deposited film is determined from the resistance measurement.

7. In a method for measuring electrical resistance $R_W$ during manufacture of thin metallic films produced under influence of a plasma, wherein a direct current or ohmic resistance measurement is made by a two-point or four-point measuring or test method, wherein the improvement comprises the steps of:

determining one of the parameters electrical resistance $R_{Mi}$ or voltage drop $U_{Mi}$ over the film for at least two different measuring or test currents $I_{Mi}$ of known magnitudes;

selecting the measuring currents in correspondence with film resistance $R_W$; and selecting a difference between the employed measuring currents such that a ratio of the measuring currents lies in a range of 2 to 100.

8. A method according to claim 7 wherein the ratio of the measuring currents is approximately 10.

9. A method according to claim 7 wherein the measuring currents flow in a same direction.

10. A method according to claim 7 wherein measurement of the at least two different measuring currents are conducted within a time interval of 0.01 to 1 second.

11. A method according to claim 7 wherein the current injected by electrons and ions, in the film by the plasma is measured.

12. A method according to claim 7 wherein the resistance measurements are used for determining variations in a concentration of the film.

* * * * *